United States Patent
Schmidhammer

(10) Patent No.: US 11,316,498 B2
(45) Date of Patent: Apr. 26, 2022

(54) RECONFIGURABLE MICROACOUSTIC FILTER AND DUPLEXER COMPRISING A RECONFIGURABLE MICROACOUSTIC FILTER

(71) Applicant: SNAPTRACK, INC., San Diego, CA (US)

(72) Inventor: Edgar Schmidhammer, Munich (DE)

(73) Assignee: SnapTrack, Inc., San Diego, CA (US)

( * ) Notice: Subject to any disclaimer, the term of this patent is extended or adjusted under 35 U.S.C. 154(b) by 0 days.

(21) Appl. No.: 16/323,216

(22) PCT Filed: Aug. 4, 2017

(86) PCT No.: PCT/US2017/045535
§ 371 (c)(1),
(2) Date: Feb. 4, 2019

(87) PCT Pub. No.: WO2018/052563
PCT Pub. Date: Mar. 22, 2018

(65) Prior Publication Data
US 2019/0190495 A1    Jun. 20, 2019

(30) Foreign Application Priority Data
Aug. 8, 2016 (DE) .......................... 102016114662.5

(51) Int. Cl.
*H03H 9/54* (2006.01)
*H03H 9/64* (2006.01)
(Continued)

(52) U.S. Cl.
CPC .............. *H03H 9/542* (2013.01); *H03H 7/12* (2013.01); *H03H 7/463* (2013.01); *H03H 9/568* (2013.01);
(Continued)

(58) Field of Classification Search
CPC ........ H03H 9/542; H03H 9/568; H03H 9/605; H03H 9/6409; H03H 7/12; H03H 7/463;
(Continued)

(56) References Cited

U.S. PATENT DOCUMENTS

| | | | | |
|---|---|---|---|---|
| 5,631,612 A | * | 5/1997 | Satoh | H03H 9/0576 333/193 |
| 8,310,321 B2 | * | 11/2012 | Kadota | H03H 9/6403 333/195 |

(Continued)

FOREIGN PATENT DOCUMENTS

| | | |
|---|---|---|
| EP | 2141805 A2 | 1/2010 |
| JP | H10163808 A | 6/1998 |
| WO | 2015128003 A1 | 9/2015 |

OTHER PUBLICATIONS

Baraka K., et al., "Controlling the bandwidth of Bulk Acoustic Wave Filter using a Decoder Designed on 65nm Process," 18th International Conference on Electronics, Circuits and Systems, (ICECS), Dec. 11, 2011, pp. 657-660, XP032095129, DOI: 10.1109/ICECS.2011.6122360, ISBN: 978-1-4577-1845-8.

(Continued)

*Primary Examiner* — Rakesh B Patel
*Assistant Examiner* — Jorge L Salazar, Jr.
(74) *Attorney, Agent, or Firm* — Patterson & Sheridan, LLP

(57) ABSTRACT

A reconfigurable microacoustic filter is specified which comprises a ladder-type-like filter topology and a suitably placed adjustable capacitive element.

6 Claims, 13 Drawing Sheets

(51) Int. Cl.
*H03H 9/56* (2006.01)
*H03H 9/60* (2006.01)
*H03H 7/12* (2006.01)
*H03H 7/46* (2006.01)

(52) U.S. Cl.
CPC .......... *H03H 9/605* (2013.01); *H03H 9/6406* (2013.01); *H03H 9/6409* (2013.01); *H03H 9/6483* (2013.01); *H03H 2210/012* (2013.01); *H03H 2210/015* (2013.01); *H03H 2210/025* (2013.01)

(58) Field of Classification Search
CPC ............... H03H 9/6406; H03H 9/6483; H03H 2210/015; H03H 2210/012; H03H 2210/025
USPC .......................... 333/133, 187, 188, 193–196
See application file for complete search history.

(56) References Cited

U.S. PATENT DOCUMENTS

| | | | |
|---|---|---|---|
| 10,326,428 B2 | 6/2019 | Ellä et al. | |
| 2004/0201434 A1 | 10/2004 | Noguchi et al. | |
| 2005/0212612 A1* | 9/2005 | Kawakubo | H03H 9/542 331/117 R |
| 2008/0197941 A1 | 8/2008 | Suzuki et al. | |
| 2009/0251235 A1 | 10/2009 | Belot et al. | |
| 2011/0316649 A1 | 12/2011 | Link et al. | |
| 2012/0286900 A1* | 11/2012 | Kadota | H03H 9/02559 333/188 |
| 2016/0211824 A1 | 7/2016 | Kando et al. | |
| 2016/0294357 A1* | 10/2016 | Tani | H03H 9/542 |

OTHER PUBLICATIONS

Hirano H., et al., "Thin Film Transfer Technology for Tunable SAW Filter Using Integrated Ferroelectric Varactors," Ultrasonics Symposium (IUS), IEEE, Oct. 18, 2011, pp. 1960-1963, XP032230462, DOI: 10.1109/ULTSYM.2011.0488, ISBN: 978-1-4577-1253-1.

Inaba M., et al., "A Widely Tunable Filter Configuration Composed of High Q RF Resonators and Variable Capacitors," European Microwave Integrated Circuit Conference, European Microwave Association, Oct. 6, 2013, pp. 320-323, XP032533838, [retrieved on Dec. 18, 2013].

International Search Report and Written Opinion—PCT/US2017/045535—ISA/EPO—dated Jan. 10, 2018.

Kadota M., et al., "Tunable Filters Using Wideband Elastic Resonators," IEEE Transactions on Ultrasonics, Ferroelectrics and Frequency Control, Oct. 2013, vol. 60, No. 10, pp. 2129-2136.

Komatsu T., et al., "Tunable Radio-Frequency Filters Using Acoustic Wave Resonators and Variable Capacitors," Japanese Journal of Applied Physics, vol. 49, No. 7, Jul. 1, 2010, pp. 07HD24-1-07HD24-4, XP055033634, ISSN: 0021-4922, DOI: 10.1143/JJAP.49.07HD24.

Partial International Search Report—PCT/US2017/045535—ISA/EPO—dated Nov. 7, 2017.

* cited by examiner

RECONFIGURABLE MICROACOUSTIC FILTER AND DUPLEXER COMPRISING A RECONFIGURABLE MICROACOUSTIC FILTER

CROSS-REFERENCE TO RELATED APPLICATIONS

This application is a national stage application under 35 U.S.C. 371 of PCT/US2017/45535, filed Aug. 4, 2017, which claims the benefit of German Application No. 102016114662.5 filed, Aug. 8, 2016, both of which are incorporated herein by reference in their entireties.

DESCRIPTION

The invention relates to microacoustic filters that are reconfigurable, and to duplexers comprising such filters.

Microacoustic filters are HF filters that work with acoustic waves and generally comprise a piezoelectric material as well as electrode structures connected thereto. Such filters can be realized with small dimensions and have good electrical properties. Thus, they are suitable for wireless communication devices such as mobile telephones. The ongoing trend for more and more functionality results in ever more stringent requirements for the filters. The increasing number of frequency bands to be operated requires an increase in HF filters, such as bandpass filters, or the use of what are known as adjustable filters with passbands, the center frequencies of which can be shifted between different frequency bands spaced apart from each other.

The requirement for communication devices to provide higher data transmission rates also increases. What is known as carrier aggregation (CA) is a means for increasing the data rate. Data are thereby transmitted simultaneously over different frequency bands. Adjustable filters, which transmit data either in one or in another frequency band, do not help in this case. Needed are filters whose filter properties—such as the characteristic frequencies, e.g. passband edges—can be set with high precision in order to not cause any interferences in the transmission behavior of the bands which are adjacent as a result of the ever increasing density of usable bands. Also needed are filters that can provide variable poles. The poles should be able to be positioned flexibly and should cover the range below a passband or above the passband, or on both sides of the passband.

The demand therefore exists for acoustic filters that allow for correspondingly precisely adjustable multiplexers, such as duplexers.

Such a filter is specified in the independent claim. Dependent claims specify advantageous embodiments.

SUMMARY OF THE INVENTION

The filter is a microacoustic filter and comprises a characteristic frequency range, a signal path with a series resonator, and a parallel path with a parallel resonator. The parallel path connects the signal path to ground. The filter furthermore comprises an adjustable capacitive element. The filter can be reconfigured by varying the adjustable capacitive element.

As a result of the reconfigurability, in contrast to an adjustable filter with respect to the characteristic frequencies the filter can be adjusted precisely to small frequency ranges and with high accuracy. The filter is a microacoustic filter, because at least one of the resonators works with acoustic waves.

SAW resonators (SAW=surface acoustic waves), BAW resonators (BAW=bulk acoustic wave) or GBAW resonators (GBAW=guided bulk acoustic wave) come into consideration as resonators. BAW resonators can be of the SMR type (SMR=solidly mounted resonator) or of the FBAR type (FBAR=film bulk acoustic resonator). In SAW resonators, comb-like interlocking electrode structures are arranged on or above a piezoelectric material. In BAW resonators, a piezoelectric material is arranged between two flat electrodes. The electrodes and the piezoelectric material are layered one on top of the other in a sandwich-like manner. BAW resonators of the SMR type have an acoustic mirror underneath the bottom electrode. BAW resonators of the FBAR type have a cavity underneath the bottom electrode. The operating frequencies of electro-acoustic resonators are substantially determined by the geometric dimensions of the electrode structures and the sound velocity. If characteristic frequency properties of filters are to be configurable with such resonators, i.e. are to be adjustable at relatively small frequency scales with an otherwise unchanged transmission characteristic, a connection to additional circuit elements is necessary. In principle, adjustable inductive elements would be conceivable. Physically easier to realize are adjustable capacitive elements. Circuits of microacoustic resonators with adjustable impedance elements constitute oscillator circuits with a complex transmission characteristic. By varying the impedance of the adjustable impedance element, a changeability of the transmission characteristic is possible. It is in this case generally problematic that the transmission behavior as a whole can be varied while only changes at the local scale are actually desired. The accomplishment therefore exists in specifying filter topologies in which the transfer function of the entire filter changes globally as little as possible, but in which local optimizations of the transfer function are possible, for example as is often desired for carrier aggregation.

In addition to the adjustable capacitive element mentioned, the filter can comprise additional adjustable capacitive elements.

It is therefore possible that the microacoustic filter is a bandpass filter and that the characteristic frequency range is a passband. Alternatively, it is possible that the filter is a band-stop filter and that the characteristic frequency range accordingly is a stopband.

It is also possible that the filter is a bandpass filter or a band-stop filter, and that the passband or the stopband can be adjusted locally, for example at its edges, while the filter functionality in the remote selection does not change, for example in case of specifically adjusted poles for suppressing undesired vibration modes.

In this respect, it is possible that the reconfigurability of the filter is obtained by a pole being shiftable with unchanged transmission characteristic in the characteristic frequency range or by a passband edge being adjusted with unchanged positions of the remaining poles.

It is furthermore possible that the reconfigurability is obtained by a local variation in the characteristic frequency range with almost unchanged transmission characteristic in the remote selection. In this context, "almost unchanged" means that specifications with respect to the remote selection can continue to be met. For example, the remote selection thereby changes by no more than a few percent (such as 3 to 4 percent), or even only a few thousandths of a percent (such as 5 to 6 thousandths).

It has been found that certain variations of filters based on ladder-type circuits are suitable for making a reconfigurability as described above possible. In this case, a ladder-type circuit has basic elements consisting of a series resonator and a parallel resonator. The series resonator is connected in the signal path. The parallel resonator is connected in a parallel path, which connects the signal path to ground. By connecting such basic elements one after the other, wherein the series resonators are connected in series in the signal path, the eponymous circuit topology is obtained. Individuals of the series or parallel resonators, as well as all resonators, can in this case be microacoustic resonators.

It is possible that the adjustable capacitive element is connected in series to a resonator in the first parallel path, as viewed in the signal direction.

The adjustable capacitive element can in this case be connected between the resonator and the ground connection. An inductive element can furthermore be connected between ground and the adjustable capacitive element. A parallel circuit consisting of an adjustable capacitor and an inductor can likewise be present and connected in series to the parallel resonator.

By varying the capacity of the adjustable capacitive element, a zero point of the transfer function of the filter, which zero point is located below a passband or a stop-band, can be shifted, without the insertion loss in the passband or stop-band or the band edges being substantially changed.

It is possible that the filter comprises two parallel paths with respectively one parallel resonator located therein. The adjustable capacitive element can be connected in the second parallel path, as viewed in the signal direction, in series to the parallel resonator of the parallel path.

By adjusting the capacity of the capacitive element, the shape of the band, for example of the passband or of the stop-band, remains substantially unchanged, while a zero point of the transfer function above the band is adjustable with respect to its position.

It is possible that the filter comprises three series resonators which are connected in series in the signal path. The adjustable capacitive element can be connected parallel to the third series resonator as viewed in the signal direction.

Such a filter can have a zero point of the transfer function below a stop-band or a passband, wherein the location of the zero point is practically unchangeable by an adjustment of the capacitive element. The bottom band edge of the band of the filter is also almost unchangeable. By contrast, the right, top band edge can be adjusted precisely.

The filter can be a bandpass filter or a band-stop filter.

It is possible that the adjustable capacitive element is connected in the first parallel path, as viewed in the signal direction, parallel to the parallel resonator of the first parallel path.

In this circuit, the position of a zero point below the band, and the top band edge, can be adjusted at the same time. The bottom band edge of the stop-band or of the passband, as well as the transfer function in the frequency range above the band, remain stable.

It is possible that the filter in the first parallel path comprises a parallel resonator between the signal path and ground. An inductive element is connected between the parallel resonator and ground. The adjustable capacitive element is connected parallel to the inductive element. This topology allows for varying the position of a zero point of the transfer function below the band with practically unchanged band edges, while the selection level with respect to the frequency range above the band is also adjustable.

It is possible that the microacoustic filter additionally comprises an adjustable phase shifter. The phase shifter can be connected in the signal path in series to the series resonators, for example at the signal output of the filter.

It is possible that the phase shifter, in addition to its adjustability, can be switched between an adjustability in the inductive range and an adjustability in the capacitive range.

This means that it is possible to adjust the phase shifter in the inductive range and that it is possible to adjust the phase shifter in the capacitive range.

It can occur, in particular in carrier aggregation, that a duplexer exhibits an inductive behavior during operation with signals from a first frequency band, while the same duplexer exhibits a capacitive behavior during operation with signals of a second frequency band. The switching capability between inductive and capacitive operation of the phase shifter makes the use of a single phase shifter possible, when otherwise two individual phase shifters would be necessary.

To this end, the phase shifter can have an adjustable range and a switchable range. In the adjustable range, impedance elements such as inductive elements or capacitive elements are connected, wherein the impedance of the adjustable range is adjustable by adjusting the impedance of one or more impedance elements, for example of a capacitive element. In the switchable range, a switch can be provided which, for example, couples the signal path to an open signal termination or connects it to ground. The coupling to ground can take place via a capacitive element and additionally via an inductive element. Due to the coupling capability of the signal path to ground via a capacitive element and via an inductive element, the switching capability between a capacitive operation and an inductive operation of the phase shifter is achieved.

The adjustable range of the phase shifter can comprise a Pi circuit with two inductive elements which are respectively connected to ground in a parallel path, and an adjustable capacitive element arranged between them in the signal path.

It is alternatively possible that the phase shifter comprises a capacitive element with constant capacity in the signal path and an inductive element with constant inductivity in a parallel path to ground. An additional capacitive element with adjustable capacity can be connected parallel to the capacitive element in the signal path. A second adjustable capacitive element can be connected parallel to the inductive element in the parallel path.

The tuning range of the adjustable capacitive element of the microacoustic filter can be n:1, wherein n is greater than 1. This means that the largest adjustable capacity is three times as large as the smallest adjustable capacity. The value of n can in this case be 1.5, 2, 3, 4, 5, 6, 10, 15, 20 or more, for example.

It is possible that the filter is a transmission filter or a reception filter of a duplexer, a triplexer, a quadplexer, generally: a multiplexer.

As a result of two bands being able to be operated simultaneously, instead of a triplexer a duplexer can be used as a multiplexer.

The following band combinations for carrier aggregation are also possible: band 8 and band 28B; band 8 and band 20; band 20 and band 28A; band 5 (band 26) and band 29; band 5 (band 26) and band 12; band 5 (band 26) and band 13; band 8 (band 26) and band 28A; band 19 (band 26) and band 28B.

The filter itself, or a mobile communication device in which the filter is connected, can additionally comprise a circuit logic for controlling and adjusting the capacitive element on the one hand and/or for controlling and adjusting the adjustable phase shifter on the other hand.

BRIEF DESCRIPTION OF THE DRAWINGS

Principles and functionalities underlying the reconfigurable microacoustic filter, as well as some exemplary embodiments, are explained in more detail in schematic Figures.

They show.

DETAILED DESCRIPTION OF THE INVENTION

Figure 1A:
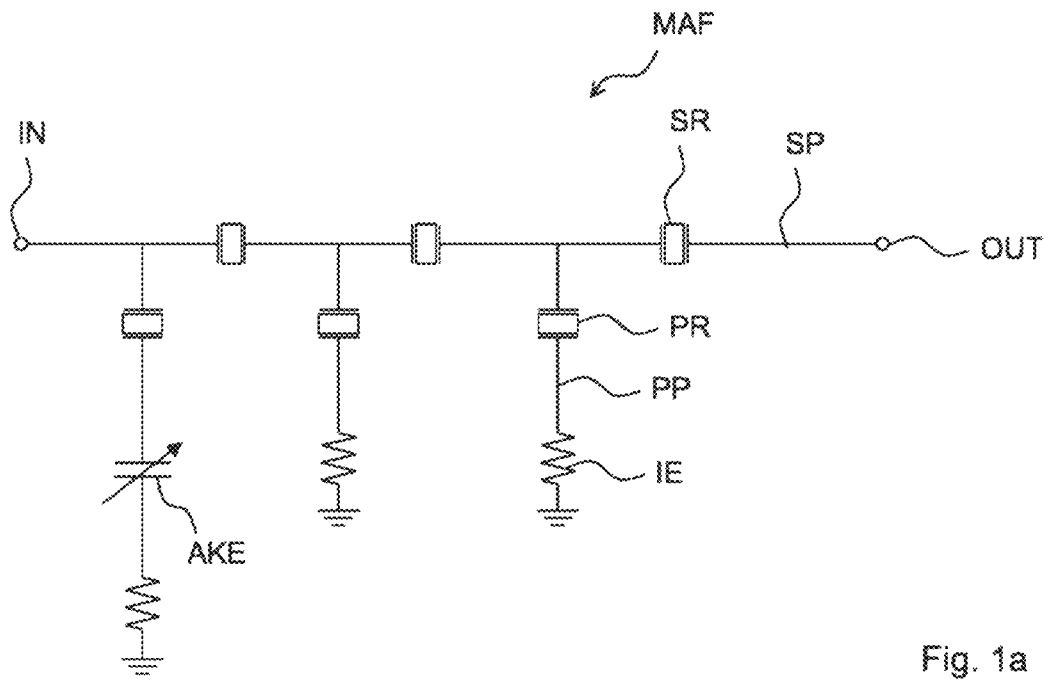
FIG. 1a a possible basic structure of a reconfigurable filter with an adjustable capacity element in the first parallel path, FIG. 1b a possible basic structure of a reconfigurable filter with an adjustable capacity element connected parallel to an inductive element, in the first parallel path, FIG. 2 a logarithmic application of the transfer functions of the circuit topology of FIG. 1 for different values of the capacity of the adjustable capacity element, FIG. 3 an enlargement of the frequency range of the passband of FIG. 2, FIG. 4 the basic structure of a possible configuration with an adjustable capacity element in the second parallel path, FIG. 5 transfer functions for different values of the capacity of the adjustable capacity element of the topology of FIG. 4, FIG. 6 the basic structure of a topology with an adjustable capacity element connected parallel to the third series resonator, FIG. 7 transfer functions for different values of the adjustable capacity element of a bandpass filter based on the topology of FIG. 6, FIG. 8 an enlargement of the passband of FIG. 7, FIG. 9 the basic structure of a filter circuit, in which the adjustable capacitive element is connected parallel to the parallel resonator of the first parallel path, FIG. 10 transfer functions associated with the circuit of FIG. 9 for different values of the adjustable capacitive element, FIG. 11 an enlargement of the passband of FIG. 10, FIG. 12 a basic structure of a filter circuit in which the adjustable capacitive element is connected parallel to an inductive element in the first parallel path, FIG. 13 transfer functions associated with the circuit of FIG. 12 for different values of the capacity, FIG. 14 an enlargement of the passband of FIG. 13, FIG. 15a the basic structure of a filter circuit, in which an adjustable capacitive element is connected to ground between the parallel paths and a common inductive element, FIG. 15b the basic structure of another filter circuit, in which an adjustable capacitive element is connected to ground between the parallel paths and a common inductive element, FIG. 15c the basic structure of another filter circuit, in which an adjustable capacitive element is connected to ground between the parallel paths and a common inductive element, FIG. 16 a basic structure of a filter circuit with adjustable phase shifter, FIG. 17 a basic structure of a filter circuit, in which an adjustable capacitive element can be controlled in a parallel path and a phase shifter can be controlled by a control circuit, FIG. 18 a basic structure of a filter circuit, in which a controlled adjustable capacitive element is connected parallel to an inductive element, FIG. 19 a possible design of an adjustable phase shifter with an adjusting region and a switching region, FIG. 20 a possible design of a phase shifter which is connected to a TX filter input of a duplexer, FIG. 21 possible tuning ranges of the adjustable phase shifter in the inductive range and in the capacitive range.

FIG. 1a shows a basic structure of a possible HF filter circuit of a microacoustic filter MAF. A signal path SP is arranged between an input IN and an output OUT. A line of series resonators, in this case a quantity of three, are connected in the signal path SP. The filter MAF furthermore comprises three parallel paths PP which connect the respective nodes of the signal path SP to ground. A parallel resonator PR is arranged in each of the parallel paths PP. An inductive element IE is optionally connected between the respective parallel resonator PR and ground. In the first parallel path as viewed in the signal direction, an adjustable capacitive element AKE with adjustable capacity is connected between the parallel resonator and the inductive element.

Figure 1B:
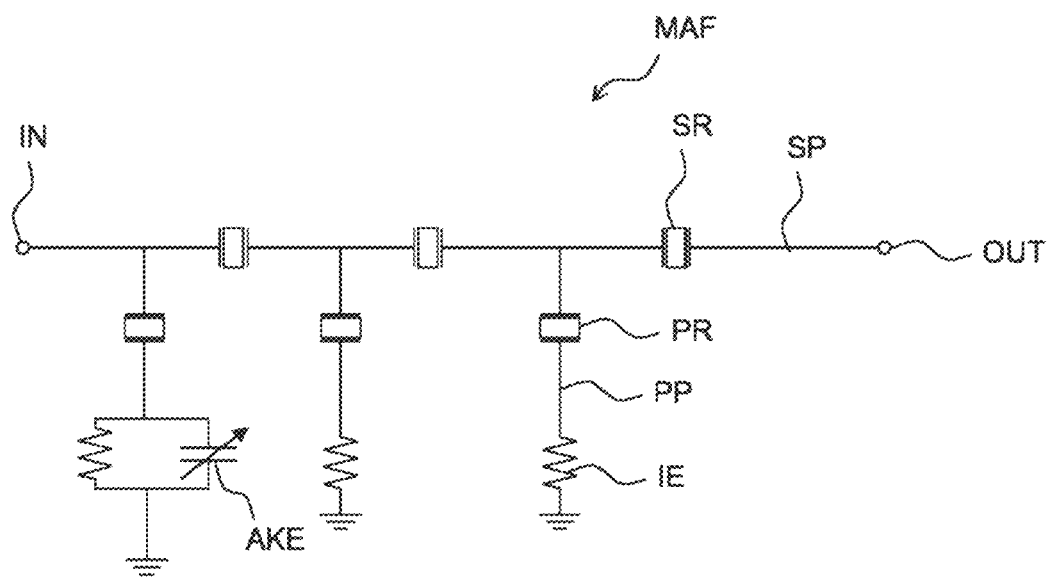

FIG. 1b shows a basic structure of another possible HF filter circuit of a microacoustic filter MAF. A signal path SP is arranged between an input IN and an output OUT. A line of series resonators, in this case a quantity of three, are connected in the signal path SP. The filter MAF furthermore comprises three parallel paths PP which connect the respective nodes of the signal path SP to ground. A parallel resonator PR is arranged in each of the parallel paths PP. An inductive element IE is connected between the respective parallel resonator PR and ground. A parallel circuit consisting of an inductive element and an adjustable capacitive element AKE with adjustable capacity is connected between the parallel resonator and ground in the first parallel path, as viewed in the signal direction.

Figure 2:
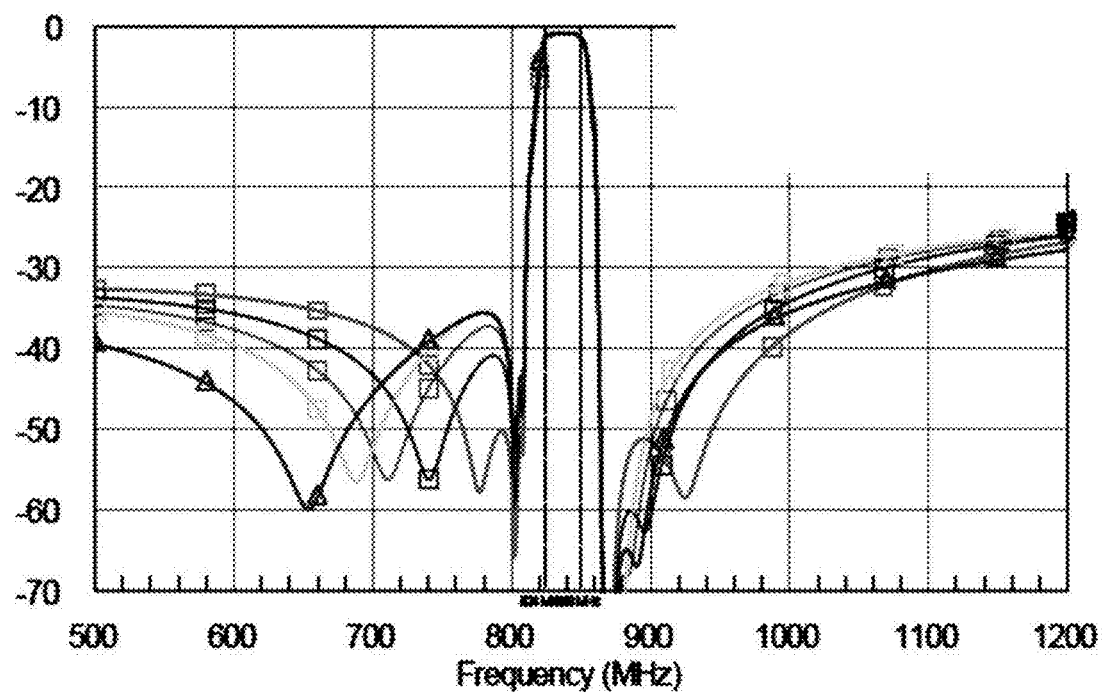
Figure 3:
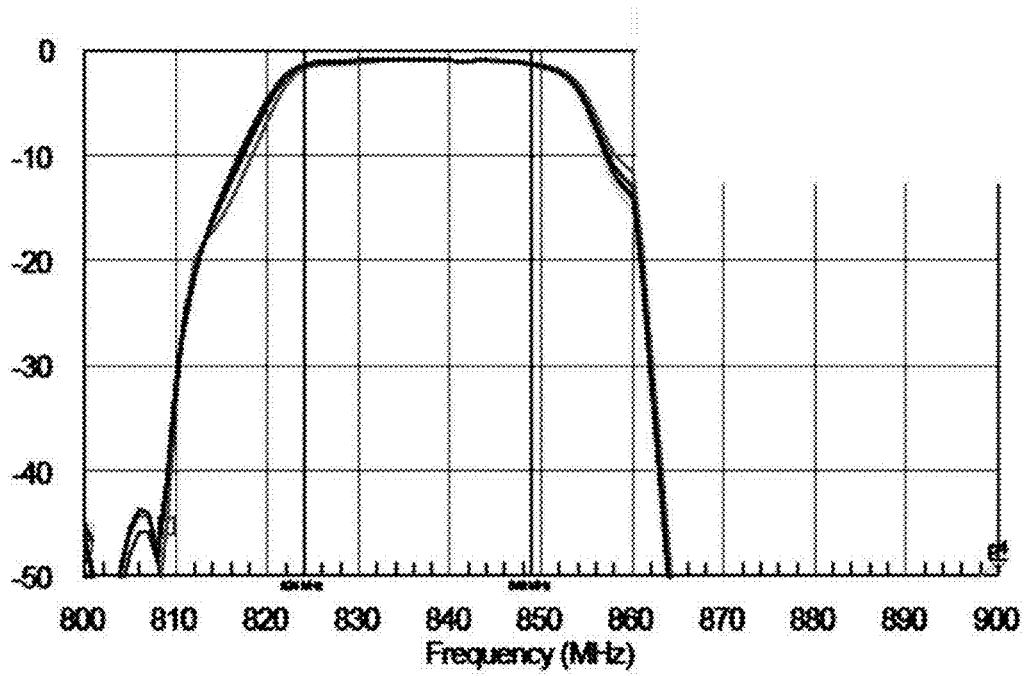

FIGS. 2 and 3 show the transfer functions of the filter of FIG. 1, designed as a bandpass filter, wherein different curves illustrate different values of the capacity of the adjustable capacitive element AKE. Despite varied capacities, the edges in the passband and the passband practically do not change. The frequency range above the passband is also almost not affected. Below the passband, a zero point of the transfer function exists, the position of which can be shifted by varying the capacity value.

Figure 4:
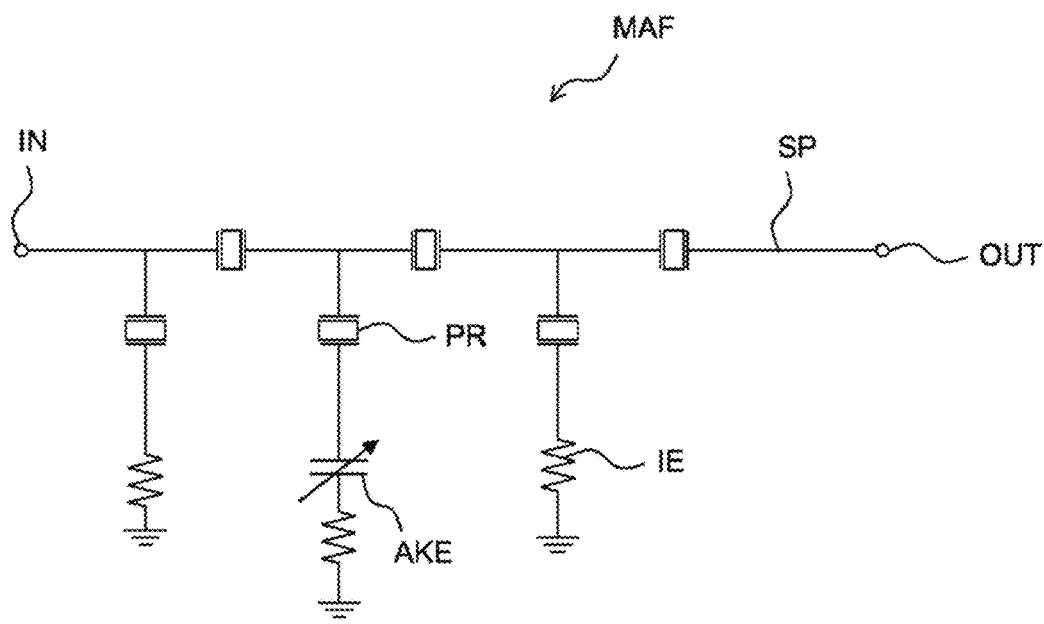
Figure 5:
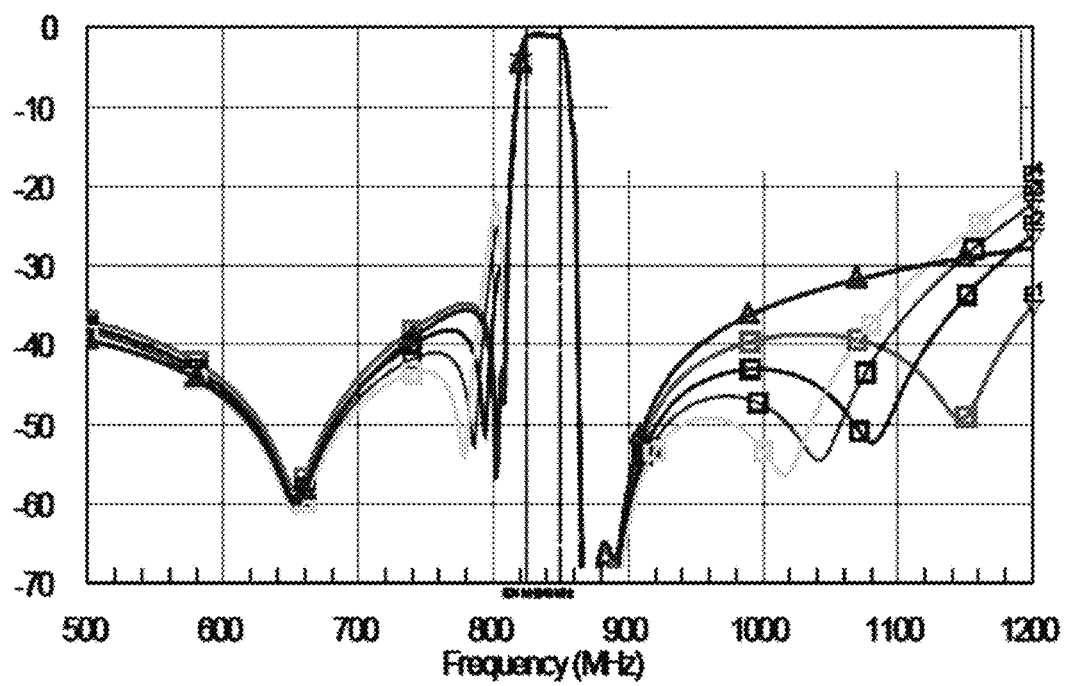

FIG. 4 shows an alternative embodiment of a circuit topology in which the adjustable capacitive element AKE is connected between the parallel resonator and an impedance element in the second parallel path. FIG. 5 shows the transfer functions associated with the different values of the capacity of the adjustable capacitive element. A zero point above the passband can be shifted. The positions of the passband itself and of a zero point below the passband remain almost unchanged.

Figure 6:
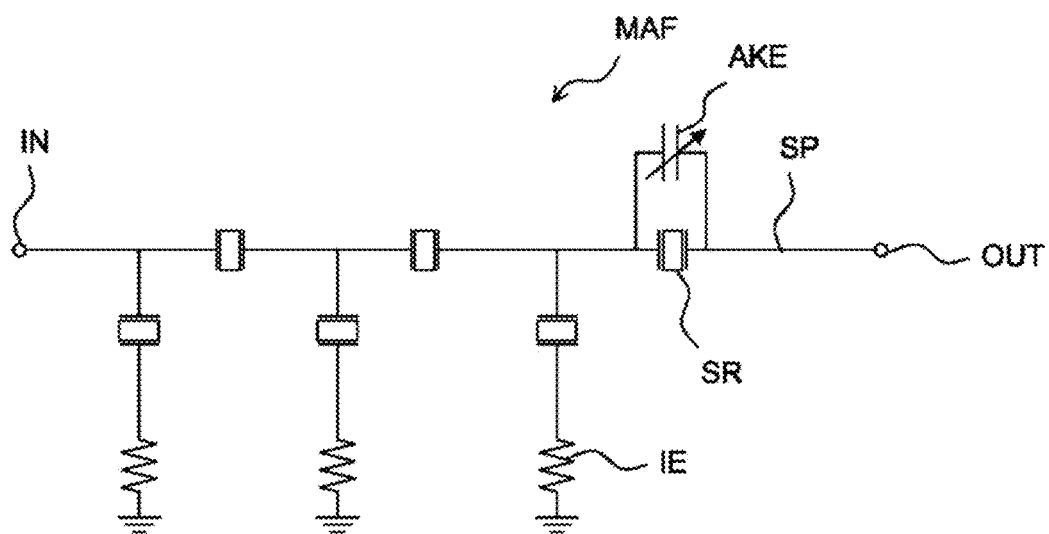

FIG. 6 shows an alternative possible topology in which the adjustable capacitive element AKE is connected parallel to the third series resonator SR.

Figure 7:
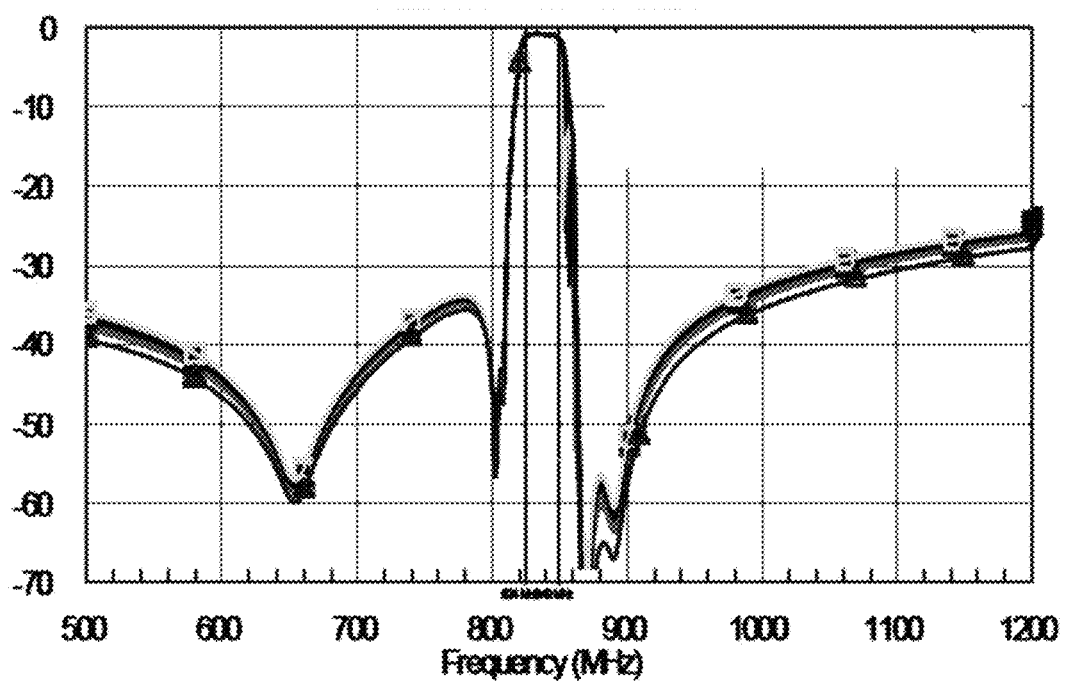
Figure 8:
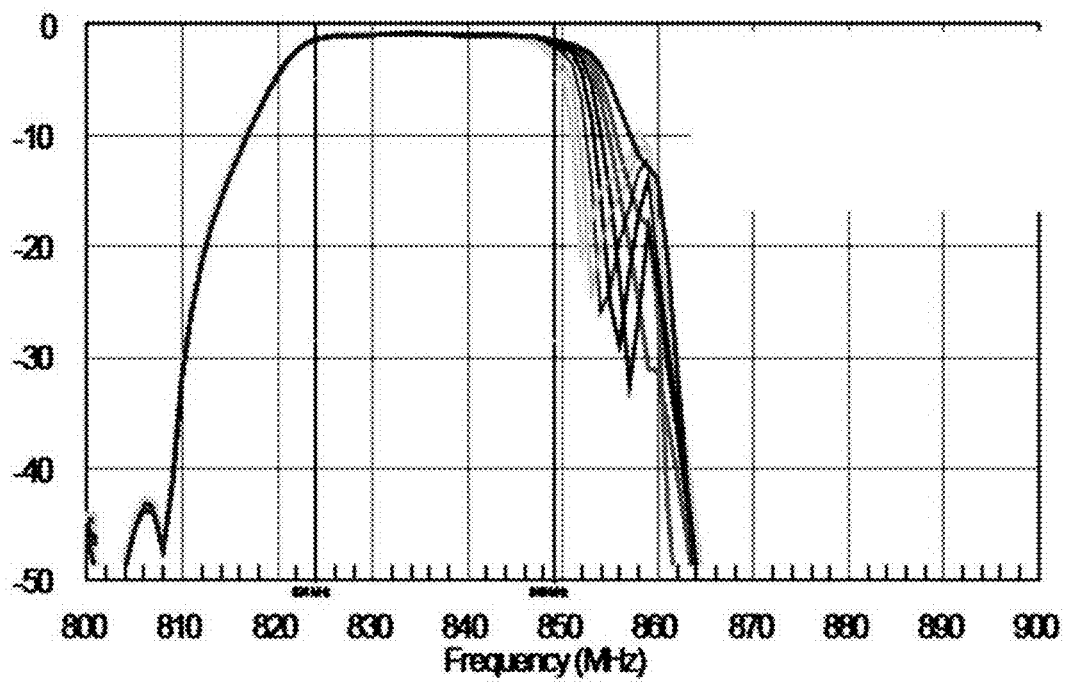

As can be seen in FIG. 7, the position of the zero point below the passband and the qualitative curve of the transfer function above the passband remain almost unchanged. The same applies to the bottom passband edge. The top passband edge, which can be seen more clearly in FIG. 8, is shifted by a variation of the capacity of the capacitive element. As a result, the bandwidth and the position of the center frequency are reconfigurable.

Figure 9:
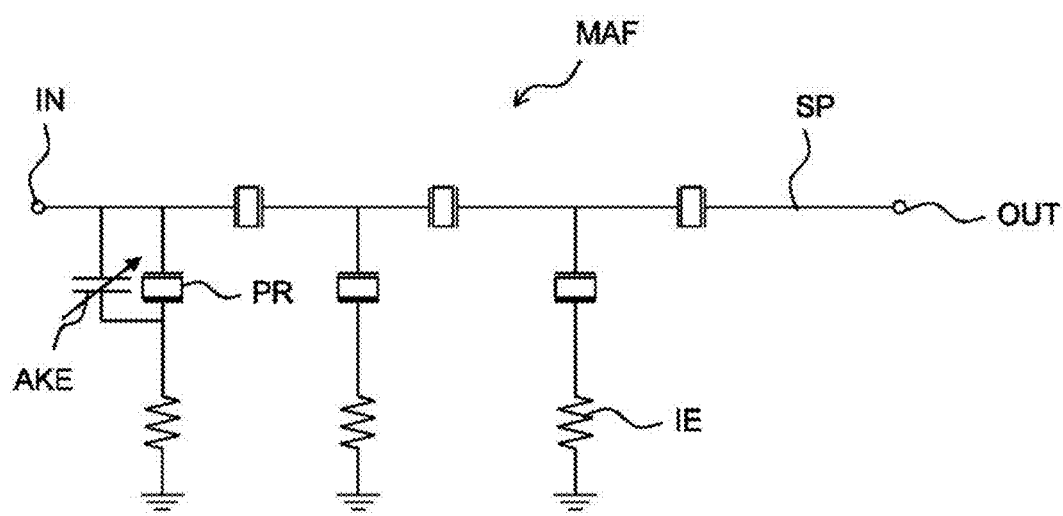
Figure 10:
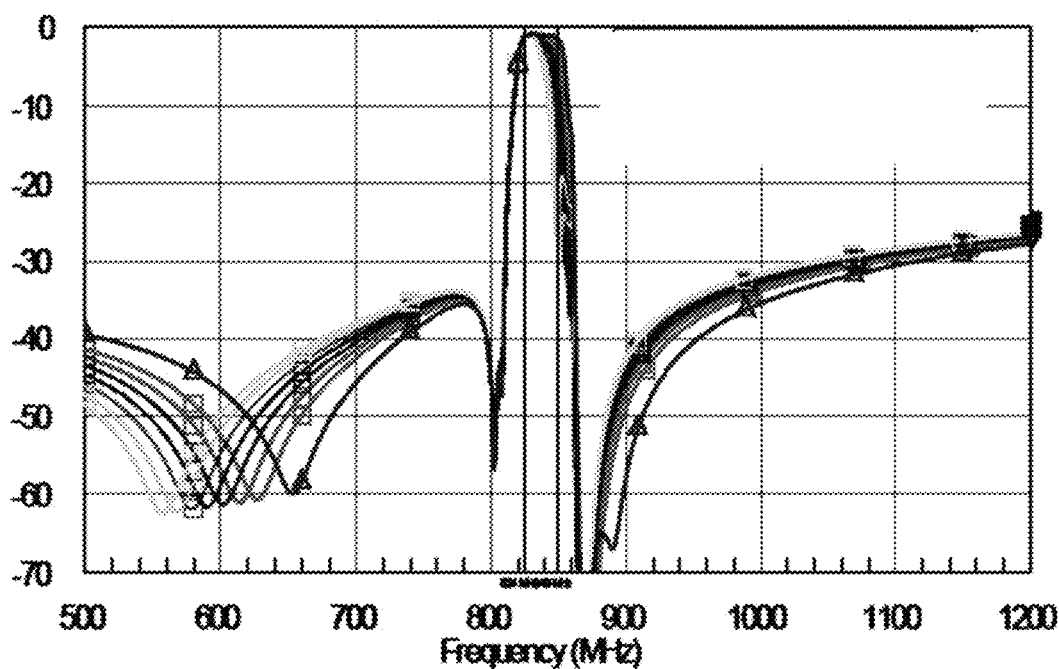

FIG. 9 shows a possible filter topology in which the adjustable capacitive element AKE is connected parallel to the parallel resonator of the first parallel path, as viewed in the signal direction. FIG. 10 shows the associated transfer functions of different values of the capacity. The position of a zero point of the transfer function as well as the position of the top passband edge are adjustable, while the bottom passband edge and the qualitative curve of the transfer function above the passband remain almost unchanged.

Figure 11:
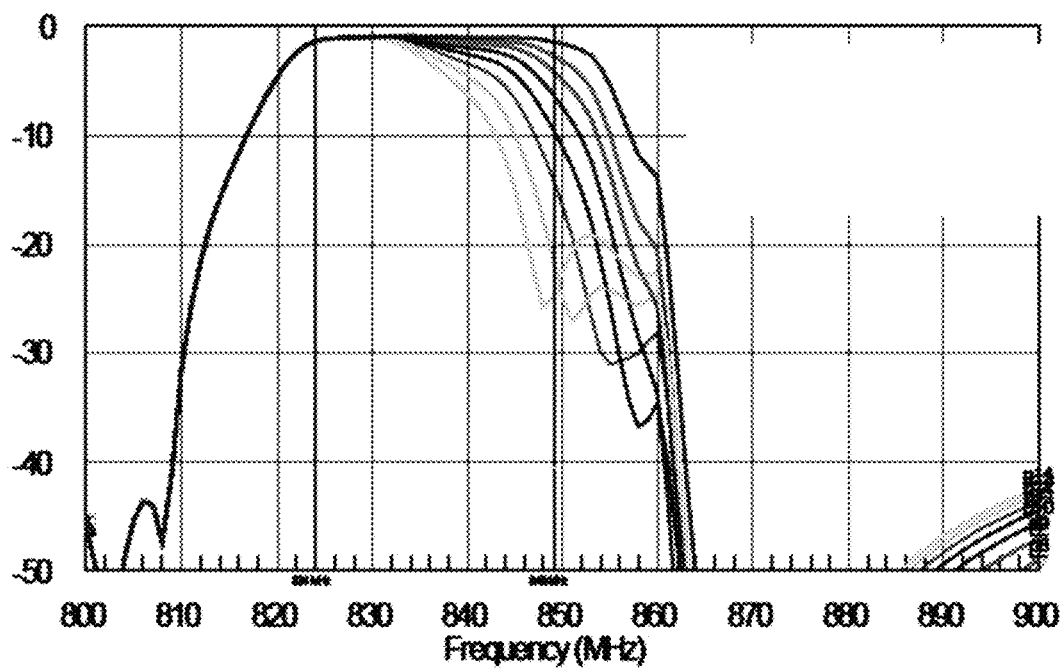

FIG. 11 shows the changeable top passband edge of FIG. 10 in an enlarged view.

Figure 12:
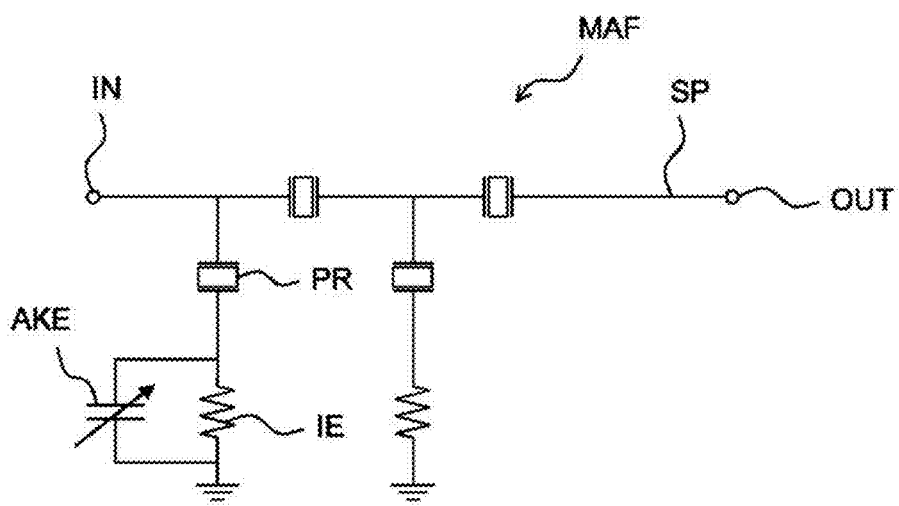
Figure 13:
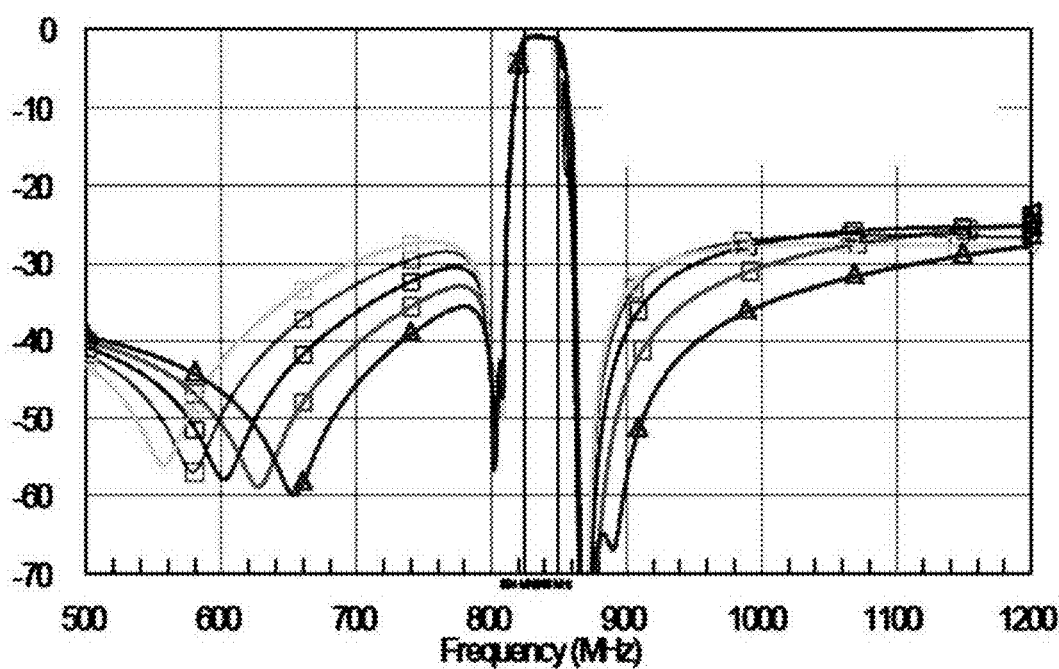
Figure 14:
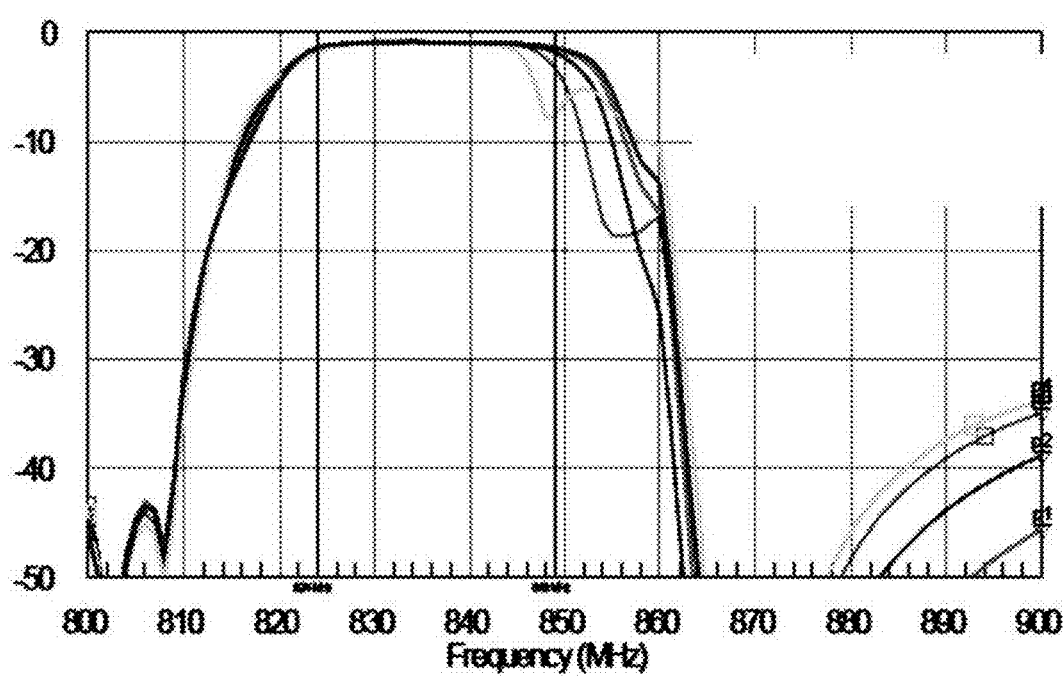

FIG. 12 shows a possible topology in which the adjustable capacitive element is connected in the first parallel path. An inductive element IE is connected between the parallel resonator PR and ground. The adjustable capacitive element AKE is connected parallel to the inductive element IE. FIG. 13 and the enlarged view of FIG. 14 show the transfer functions associated with different values of the capacity. The position of the pole below the passband and, to a lesser extent, the position of the top passband edge are configurable.

Figure 15A:
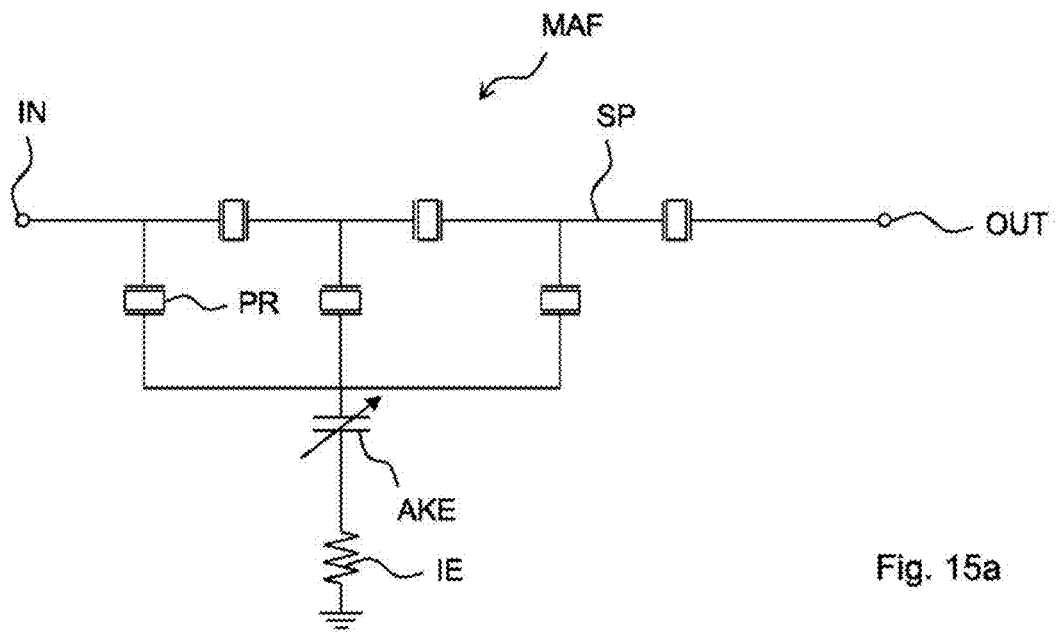

FIG. 15a shows a possible topology in which a common inductive element IE connects the three parallel paths to ground. An adjustable capacitive element AKE is connected between the three parallel resonators and the inductive element IE.

Figure 15B:
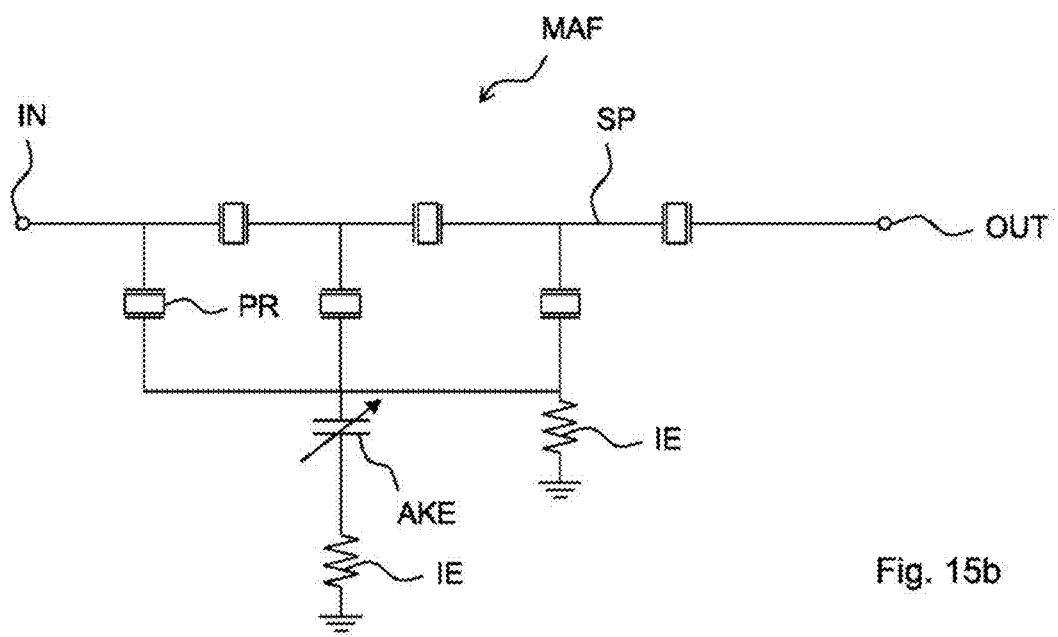

FIG. 15b again shows a possible topology in which a common inductive element IE connects the three parallel paths to ground. An adjustable capacitive element AKE is connected between the three parallel resonators and the inductive element IE. The output port OUT can at the same time be the port to an antenna connector of a multiplexer. The parallel resonator located closest to the antenna connector is additionally connected to ground via an inductive element with very little inductance.

Figure 15C:
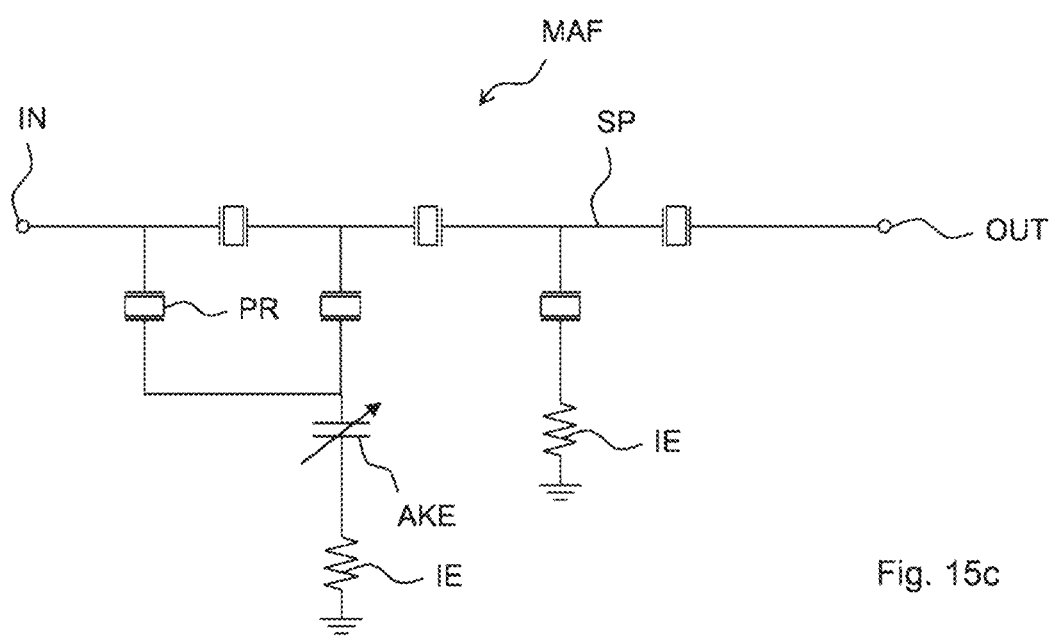

FIG. 15c shows a possible topology in which a common inductive element IE connects the three parallel paths to ground. An adjustable capacitive element AKE is connected between the three parallel resonators and the inductive element IE. The output port OUT can again at the same time be the port to an antenna connector of a multiplexer. The parallel resonator located closest to the antenna connector is connected to ground via an inductive element with very little inductance without any additional coupling to the adjustable capacitive element.

Figure 16:
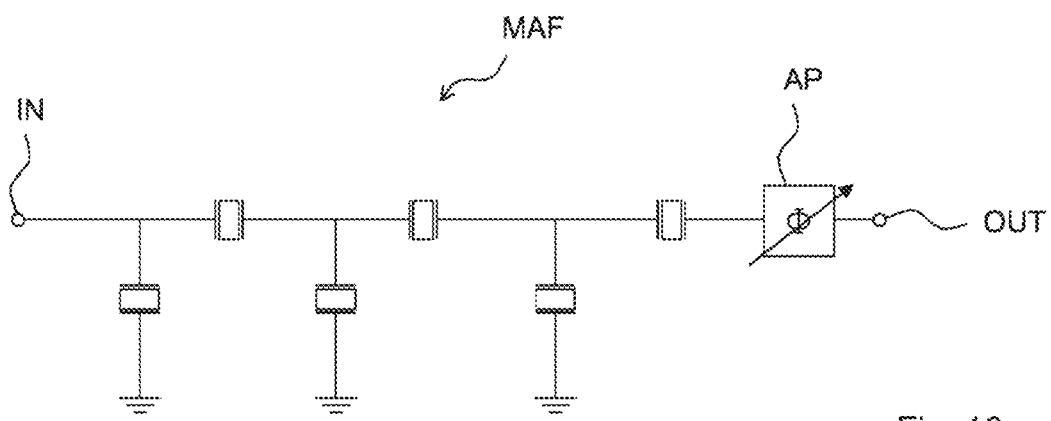

FIG. 16 shows the use of an adjustable phase shifter AP in the signal path of a microacoustic filter, drawn in this case without any additional circuit elements for the sake of simplicity.

Figure 17:
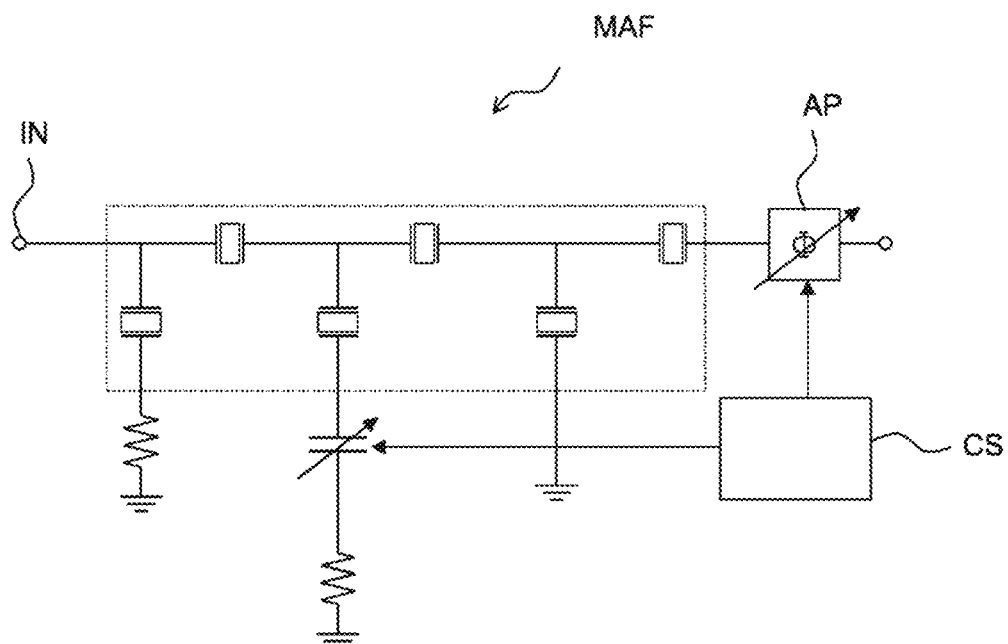

FIG. 17 shows the use of a control circuit CS which can control the capacity of the adjustable capacitive element and/or the effect of the adjustable phase shifter AP on the phasing of an HF signal for improved interaction with other filters for carrier aggregation. The control circuit CS can in this case be part of the microacoustic filter MAF, or part of the logic circuits of the associated communication device.

Figure 18:
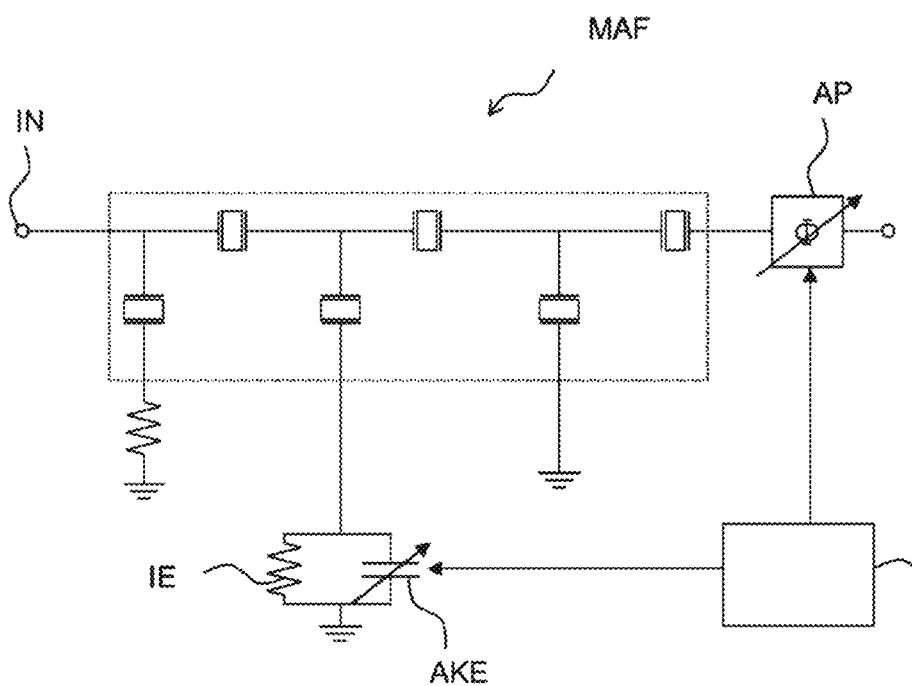

FIG. 18 shows a regulation of the capacity of the adjustable capacitive element AKE and/or of the phase shift of the adjustable phase shifter AP, wherein the adjustable capacitive element AKE is connected parallel to an inductive element.

Figure 19:
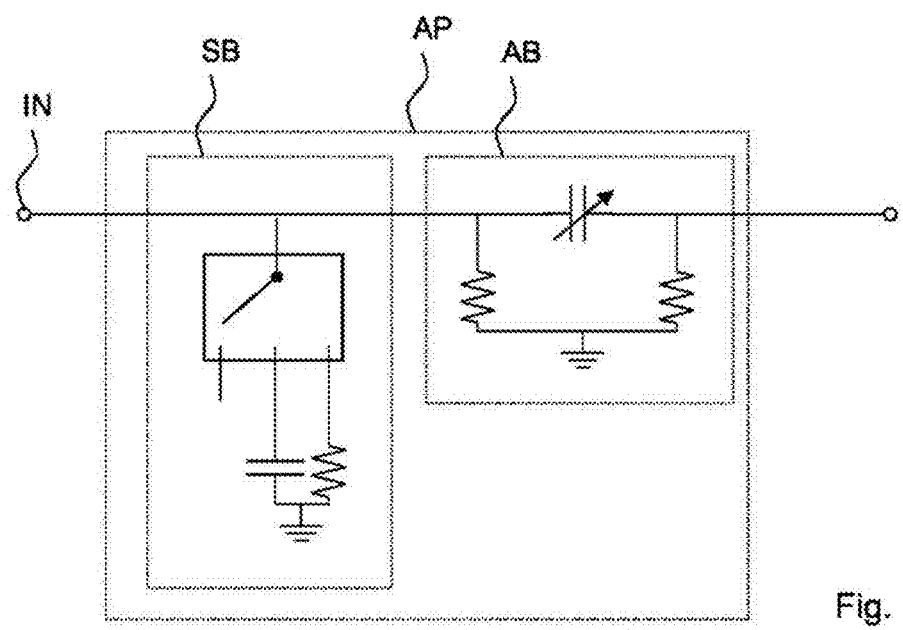

FIG. 19 shows a possible embodiment of the adjustable phase shifter AP which comprises an adjustable region AB and a switching region SB. The adjustable region contains a Pi circuit with two inductive elements to ground and an adjustable capacitive element between the inductive elements. How far the adjustable phase shifter AP rotates the phase of an HF signal received at the input IN is determined by varying the capacity of the adjustable capacitive element.

Arranged in the switching region SB is a switch which connects the signal path to a switching state in the idle state (left), to a capacitive element (center), or to an inductive element (right). A connection to ground is achieved via the capacitive element or the inductive element. As a result of the right two possible switch positions, switching between a capacitive and an inductive operating mode of the adjustable phase shifter AP is possible.

Figure 20:
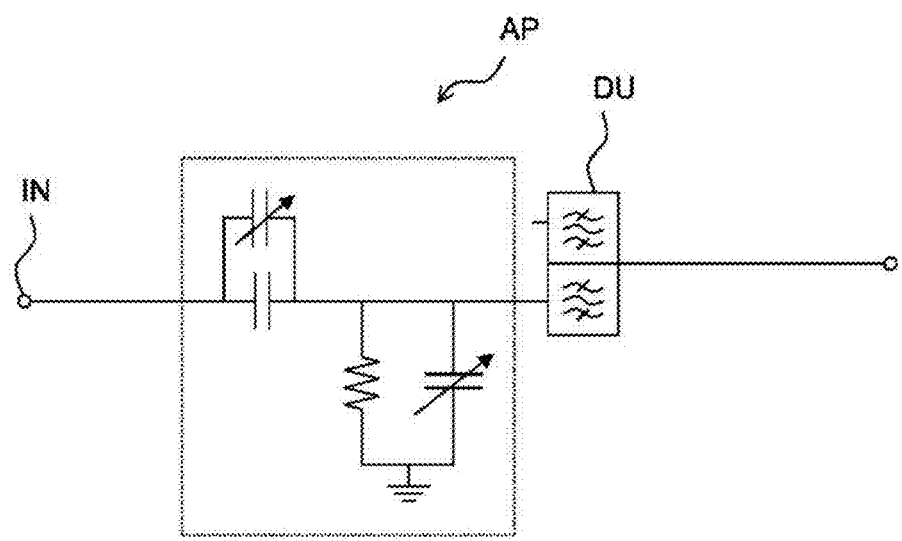

FIG. 20 shows a possible embodiment of an adjustable phase shifter with a capacitive element of constant capacitance in the signal path. An inductive element of constant inductance is connected in a parallel path. A first adjustable capacitive element is connected parallel to the capacitive element of constant capacitance. A second adjustable capacitive element is connected parallel to the inductive element.

The adjustable phase shifter AP can be connected to a duplexer. As shown in FIG. 20, in this way the adjustable phase shifter can be connected between a port IN, at which HF signals are provided, and the input of a reception filter of the duplexer.

Figure 21:
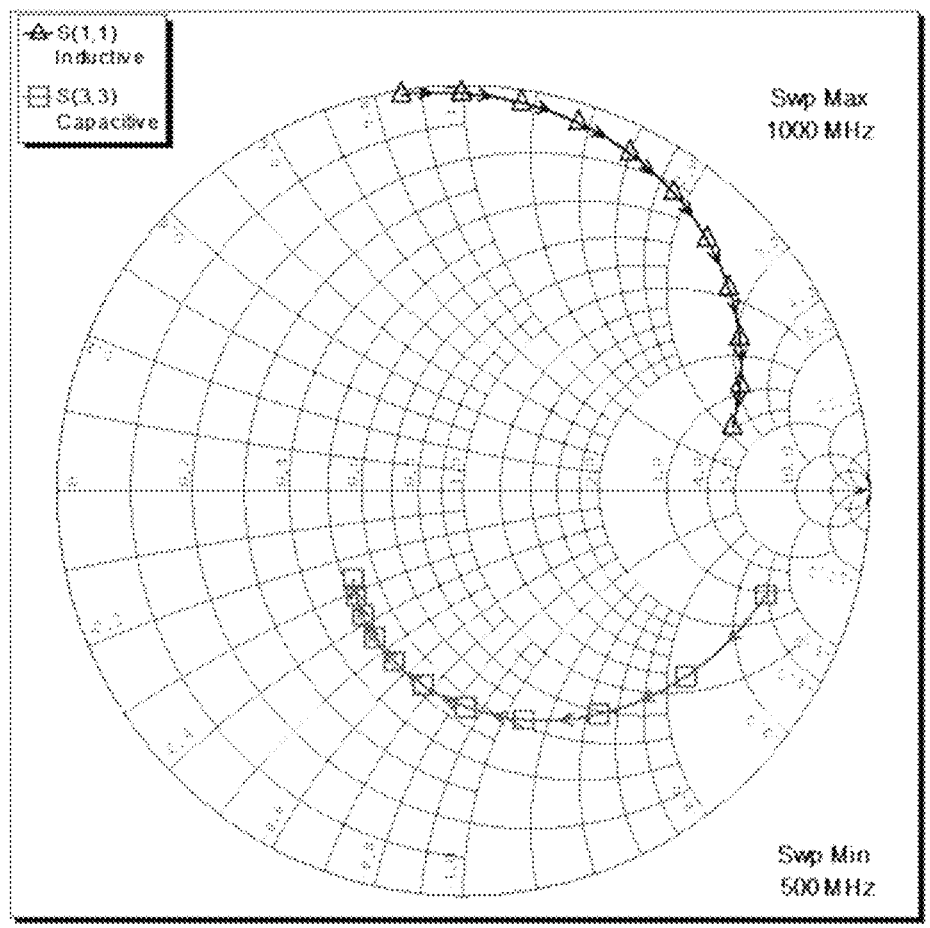

FIG. 21 shows frequency-dependent possible starting points of the adjustable duplexer in the capacitive range and in the inductive range. Switching between the inductive and the capacitive range is possible by operating a switch. The phasing can be adjusted in small steps by varying the capacitance of the adjustable capacitive element of the adjustable phase shifter.

The advantage of switching between an inductance and a capacitance in FIG. 19 exists in that the phase makes a distinct jump so that the range in which a duplexer can be shifted with respect to its phase is significantly extended. The range defined by the topology (which actually includes unreachable ranges, "blind spots") can furthermore be switched so that the magnitude of the blind spots is reduced in the Smith chart or so that the blind spots are possibly eliminated.

The reconfigurable microacoustic filter is not limited to the exemplary embodiments described and the Figures shown. Filters with additional resonators, such as series resonators in the signal path or parallel resonators in parallel paths; and additional circuit elements, such as impedance adjustment circuits; and additional filters of higher order multiplexers are also a component of the filter.

LIST OF REFERENCE SYMBOLS

AB: Adjustment region
AKE: Adjustable capacitive element
AP: Adjustable phase shifter
CS: Control circuit
DU: Duplexer
IE: Impedance element
IN: Signal input
MAF: Microacoustic filter
OUT: Signal output
PP: Parallel path
PR: Parallel resonator
SB: Switching region
SP: Signal path
SR: Series resonator

The invention claimed is:
1. A microacoustic filter comprising:
a characteristic frequency range;
a signal path with an adjustable phase shifter and a series resonator;

a plurality of parallel paths which connects the signal path to ground, each of the parallel paths having a parallel resonator; and at least one of the parallel paths further comprising an adjustable capacitive element connected in series to the parallel resonator of the at least one parallel path, wherein the filter can be reconfigured by varying the adjustable capacitive element and wherein the adjustable phase shifter can be switched between an adjustability in the inductive range and an adjustability in the capacitive range.

2. The microacoustic filter according to claim 1, wherein the adjustable phase shifter is connected to a duplexer.

3. A microacoustic filter comprising:
a characteristic frequency range;
a signal path with an adjustable phase shifter and at least one series resonator;
a plurality of paths connecting the signal path to ground, each of the paths having a parallel resonator; and
at least one of the plurality of paths further comprising a first adjustable capacitive element coupled to a shunted resonator, wherein the microacoustic filter is reconfigurable by varying the first adjustable capacitive element, and wherein the adjustable phase shifter is configured to be switched between an adjustability in an inductive range and an adjustability in a capacitive range.

4. The microacoustic filter according to claim 3, wherein a second adjustable capacitive element is connected in parallel to the at least one series resonator, and wherein the microacoustic filter is further reconfigurable by varying the second adjustable capacitive element.

5. The microacoustic filter according to claim 3, wherein a second adjustable capacitive element is connected in parallel to the parallel resonator of one of the plurality of paths, and wherein the microacoustic filter is further reconfigurable by varying the second adjustable capacitive element.

6. The microacoustic filter according to claim 3, wherein one of the plurality of paths comprises an inductive element coupled between the parallel resonator and a ground node, wherein a second adjustable capacitive element is connected in parallel to the inductive element, and wherein the microacoustic filter is further reconfigurable by varying the second adjustable capacitive element.

* * * * *